(12) United States Patent
Schnetter

(10) Patent No.: US 10,830,843 B2
(45) Date of Patent: Nov. 10, 2020

(54) METHOD FOR A MAGNETIC RESONANCE SYSTEM FOR PATIENT PROTECTION

(71) Applicant: Siemens Healthcare GmbH, Erlangen (DE)

(72) Inventor: Volker Schnetter, Nuremberg (DE)

(73) Assignee: Siemens Healthcare GmbH, Erlangen (DE)

(*) Notice: Subject to any disclaimer, the term of this patent is extended or adjusted under 35 U.S.C. 154(b) by 218 days.

(21) Appl. No.: 16/103,161

(22) Filed: Aug. 14, 2018

(65) Prior Publication Data
US 2019/0056465 A1 Feb. 21, 2019

(30) Foreign Application Priority Data

Aug. 17, 2017 (DE) .......... 10 2017 214 364

(51) Int. Cl.
*G01R 33/28* (2006.01)
*G01R 33/36* (2006.01)

(52) U.S. Cl.
CPC ........ *G01R 33/288* (2013.01); *G01R 33/3614* (2013.01)

(58) Field of Classification Search
None
See application file for complete search history.

(56) References Cited

U.S. PATENT DOCUMENTS

| 9,625,541 B2 | 4/2017 | Fontius et al. |
| 2003/0098687 A1 | 5/2003 | Arneth et al. |
| 2005/0197077 A1* | 9/2005 | Bielmeier ............ G01R 33/543 455/115.1 |
| 2010/0081857 A1* | 4/2010 | Georgi ............... A61K 51/1045 600/1 |
| 2011/0172515 A1 | 7/2011 | Fautz et al. |

(Continued)

FOREIGN PATENT DOCUMENTS

| DE | 10150137 A1 | 5/2003 |
| DE | 102004006552 A1 | 9/2005 |
| DE | 102010004514 A1 | 7/2011 |

OTHER PUBLICATIONS

German Office Action for German Application No. 102017214364.9, dated Apr. 20, 2018.

(Continued)

*Primary Examiner* — Douglas X Rodriguez
(74) *Attorney, Agent, or Firm* — Lempia Summerfield Katz LLC

(57) ABSTRACT

The present disclosure relates to a method for a magnetic resonance system to protect a patient from being damaged by irradiated radio frequency power. In the method, amount information about maximum energy is determined as a function of a damage model for a patient to be examined with the magnetic resonance system. The maximum energy indicates the maximum radio frequency energy that may be radiated into the patient during the examination of the patient. Furthermore, an amount of energy emitted by a radio frequency amplifier of the magnetic resonance system during the examination of the patient in the magnetic resonance system is determined, and the radio frequency amplifier is adjusted as a function of a comparison of the amount information with the amount of energy emitted by the radio frequency amplifier.

14 Claims, 2 Drawing Sheets

(56) References Cited

U.S. PATENT DOCUMENTS

2012/0256626 A1 10/2012 Adalsteinsson et al.
2014/0249401 A1* 9/2014 Van Den Brink ..... G01R 33/28
                                                        600/410
2016/0091583 A1 3/2016 Saybasili et al.

OTHER PUBLICATIONS

International Electrotechnical Commission. "International standard, medical equipment—IEC 60601-2-33: particular requirements for the safety of magnetic resonance equipment for medical diagnosis." (2010).

* cited by examiner

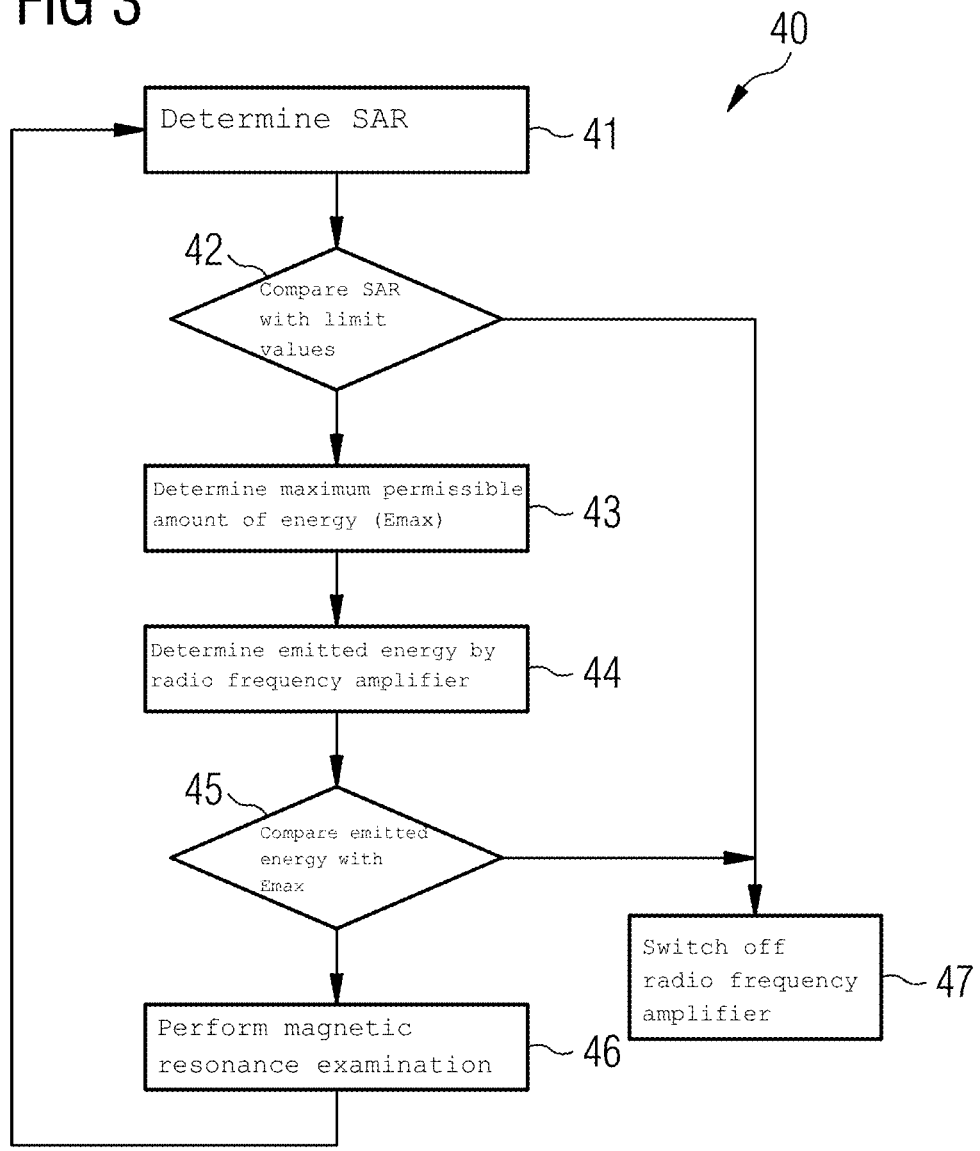

METHOD FOR A MAGNETIC RESONANCE SYSTEM FOR PATIENT PROTECTION

The application claims the benefit of German Patent Application No. DE 10 2017 214 364.9, filed Aug. 17, 2017, which is hereby incorporated by reference in its entirety.

TECHNICAL FIELD

The present disclosure relates to a method for a magnetic resonance system and a correspondingly designed magnetic resonance system, which prevent harmful exposure of a patient to electromagnetic radiation.

BACKGROUND

Magnetic resonance examinations may be used for the diagnosis of a multiplicity of diseases. A particular advantage of the magnetic resonance examination is that a patient is not exposed to any radioactive or ionizing radiation in the examination, as is the case, for example, in an X-ray examination. Nonetheless, in the magnetic resonance examination, the patient is exposed to electromagnetic fields which may be absorbed by the biological tissue. During a magnetic resonance examination, a rotating magnetic field (B-field) is generated to generate magnetic resonance images which leads to an induced voltage whereby currents may flow in the patient. These induced currents and, if necessary, further displacement currents result in corresponding heating of the tissue of the patient. When carrying out a magnetic resonance examination, this heating is limited. The so-called Specific Absorption Rate (SAR) is used to measure the absorption of electromagnetic field energy in biological tissue. The heating of the tissue of the patient is limited by the manufacturer of the magnetic resonance devices by observing appropriate standards (for example, IEC 60601-2-33). SAR limits are observed which limit the temperature increase in the tissue. Corresponding methods are, for example, specified in U.S. Pat. No. 9,625,541 B2, U.S. Patent Application Publication No. 2012/0256626 A1, German Patent Publication No. DE 102010004514 A1, or U.S. Patent Application Publication No. 2016/0091583 A1.

The SAR may be monitored online. With online monitoring, for example, the radio frequency power emitted is determined by a voltage measurement. The power dissipation remaining in the transmitter coil may be deducted from this. The whole-body and/or partial-body SAR is calculated using the mass of the patient and/or the mass of the irradiated body part of the patient.

For various regions of the body, (e.g., the head), an exposed part of the body or the whole body, and operation modes (e.g., according to the IEC standard: normal operation mode, first level controlled operation mode), different limits apply which furthermore in the case of the whole-body SAR are also dependent on the ambient temperature and/or in the case of the partial-body SAR are dependent on the exposed mass. This information may be determined in advance using a computer program and transferred to a monitoring unit before or during online monitoring. This may be necessary if the position of the patient changes in the field and another area is to be monitored as a result.

A distortion of the values determined by the computer program may therefore immediately lead to a risk to the patient. High demands are therefore placed on the reliability of the computer programs and the hardware used. If, for example, the unit for online monitoring fails to detect the uncontrolled behavior of, for example, the transmitter chain, the safety of the patient may be jeopardized, above all, if the maximum possible radio frequency transmission power is emitted by the radio frequency amplifier. To meet these high safety requirements, it may be useful to introduce a second monitoring unit operating independently of the existing unit and serving the purpose of preventing serious damage to the patient in the event of the failure of the existing monitoring unit.

SUMMARY AND DESCRIPTION

The scope of the present disclosure is defined solely by the appended claims and is not affected to any degree by the statements within this description. The present embodiments may obviate one or more of the drawbacks or limitations in the related art.

As a mere duplication of the existing monitoring unit is economically very expensive, it is an object of the present disclosure to provide a more cost-effective alternative to the solution of this problem.

This object is achieved by a method for a magnetic resonance system, a correspondingly designed magnetic resonance system, a computer program product, and an electronically readable data carrier.

In the method for the magnetic resonance system, information regarding the maximum amount of energy is determined as a function of a damage model for a patient to be examined with the magnetic resonance system. In other words, a maximum amount of energy is determined for the patient to be examined as a function of the damage model. The maximum energy indicates the maximum amount of radio frequency energy which may be radiated into the patient during the examination of the patient. Furthermore, an amount of energy emitted by a radio frequency amplifier of the magnetic resonance system is determined during the examination of the patient in the magnetic resonance system. The radio frequency amplifier is adjusted as a function of a comparison of the amount information with the amount of energy emitted by the radio frequency amplifier.

The basic idea behind this method is that a certain amount of energy is required for an injury, (e.g., burns on or in the body of the patient). This amount of energy (e.g., amount information of maximum energy) is calculated with an appropriate damage model and compared to the amount of energy emitted by the radio frequency amplifier of the magnetic resonance system. It is thus possible to roughly estimate when an injury to the patient is to be expected and to adjust, for example, to regulate the radio frequency amplifier accordingly.

According to an embodiment, the radio frequency amplifier is switched off when the amount of energy emitted by the radio frequency amplifier exceeds the amount information. It is thus possible to provide that overall the patient is not given more than the permitted maximum amount of radiation energy.

In a further embodiment, the power emitted by the radio frequency amplifier over time is detected, while the patient is being examined in the magnetic resonance system. The power emitted by the radio frequency amplifier may be determined in a relatively simple manner, for example, by corresponding current and/or voltage measurements at the input or output of the radio frequency amplifier. At the same time, the power emitted by the radio frequency amplifier represents a reliable estimate of the maximum radio frequency energy radiated into the patient. The output power may be integrated over time, and thus the radio frequency amplifier may be switched off in good time before a harmful amount of energy is radiated into the patient.

In a further embodiment, the damage model includes an Arrhenius model. According to the Arrhenius model, burns may be described as a first-order kinetic reaction by the Arrhenius equation. For example, time-dependent tissue damage information may be determined by an integral of chemical reaction kinetics over time according to the damage model. This enables a relatively good and simple estimate of the time from when an injury of the tissue of the patient is to be expected.

The time-dependent tissue damage information may be determined as a function of a maximum deliverable power of the radio frequency amplifier and a mass of the patient. These variables may be detected with relatively ease and reliability such that the time-dependent tissue damage information may be reliably determined and a time for an adjustment and/or shutdown of the radio frequency amplifier may thus be reliably determined.

In particular, the time-dependent tissue damage information may be determined by an approximation. For this purpose, it is assumed that the power in the patient in the first approximation is proportional to their total mass. This approximation enables a relatively good estimate of the time-dependent tissue damage information by the maximum deliverable power of the radio frequency amplifier, but without knowing the precise efficiency of the transmitter.

Further parameters that may be included in the determination of time-dependent tissue damage information include, for example, a tissue-specific pre-exponential factor, tissue-specific activation energy, an absolute tissue temperature before heating, a specific thermal capacity of the tissue of the patient, and a time constant of the heating process. These parameters enable, for example, a determination of the time-dependent tissue damage information by way of a damage integral according to the Arrhenius equation. The parameters may be estimated relatively well for human tissue or may be determined from measurements and simulations. Furthermore, the tissue damage information may be determined as a function of an advantage factor of a local Specific Absorption Rate (SAR) versus a global SAR. These corresponding advantage factors are known or may be determined for various magnetic resonance scans. The time-dependent tissue damage information may further be determined as a function of a smallest patient mass in which a level of efficiency of 50% is achieved. The level of efficiency relates to the power radiated into the patient in relation to the power output by the radio frequency amplifier. The aforementioned approximation may be performed by this smallest patient mass at which a level of efficiency of 50% is achieved.

According to one embodiment, the time-dependent tissue damage information $\Omega$ for the time $t_{max}$ is determined according to the following equation:

$$\Omega(t_{max}) = A \int_0^{t_{max}} \frac{-E_a}{e^{R\left(T_{start} + \frac{F}{m+m_0} P_s \frac{\tau}{C}\left(1-e^{\frac{-t}{\tau}}\right)\right)}} dt$$

In the equation, A denotes the tissue-specific pre-exponential factor, $E_a$ the tissue-specific activation energy, R the universal gas constant, $T_{start}$ the absolute tissue temperature before heating, F the advantage factor of the local SAR versus the global SAR, m the mass of the patient, $m_0$ the smallest patient mass at which a level of efficiency von 50% is achieved, $P_S$ the maximum deliverable power of the radio frequency amplifier, $\tau$ the time constant of the heating process, and C the specific thermal capacity of the tissue of the patient. The mass of the patient and the maximum deliverable power of the radio frequency amplifier may be measured or determined appropriately, for example, based on technical conditions of the magnetic resonance system. The remaining parameters may be determined by appropriate worst case assumptions. Limit values for the tissue damage information $\Omega$ may also be set appropriately, for example, by simulations, calculations, or experiments. This then results in the permissible time $t_{max}$ in which the maximum transmission power may be output. This in turn results in the maximum permissible amount of energy which is to be limited to avoid serious injury of the patient.

In further embodiments, the tissue damage information may be determined more precisely by, for example, determining the time constant of the heating process as a function of a perfusion in the tissue of the patient. The perfusion of the tissue, (e.g., the blood flow of the tissue), may differ as a function of a patient's condition. For example, perfusion in older patients or in diabetic patients may be lower than in younger patients and non-diabetic patients. With increasing perfusion, local heating may be dissipated more quickly, whereby the locally achievable maximum temperature decreases.

Alternatively, or in addition, the time constant of the heating process may be determined as a function of the thermoregulation of the patient. Thermoregulation may differ in the case of diseases or certain patient conditions, (e.g., in situations involving shock or stress), whereby the time constant of the heating process may change.

By taking into account the perfusion and/or thermoregulation of the patient, the tissue damage information may therefore be more precisely assessed.

In a further embodiment, the time-dependent tissue damage information is determined as a function of the body size and/or the age of the patient. As result, for example, the body fat percentage may be taken into account, which influences the absorbed power. Above all in babies, by taking into account the developmentally fluctuating body fat percentage, the absorbed power may be taken into account more precisely. Based on body size, the area penetrated by the magnetic fields may be taken into account, which influences the induced voltage and thus, the absorbed power in the body.

As an alternative to the Arrhenius model, the damage model may include a so-called CEM43 model (cumulative equivalent minutes at 43° C.).

In another embodiment, a specific absorption rate (SAR) for the absorption of electromagnetic fields from the radio frequency amplifier in the patient is further determined, and the radio frequency amplifier is turned off as a function of a comparison of the specific absorption rate with an absorption rate threshold. In other words, conventional online monitoring may be operated based on the specific absorption rate in combination with the previously described method which controls the radio frequency amplifier based on time-dependent tissue damage information of a damage model. As a result, two differently operating control mechanisms for patient protection may be provided, which may protect the patient from damage in a magnetic resonance system independently of one another.

A magnetic resonance system is further provided, wherein the system includes a gradient field system, a high frequency antenna, a radio frequency amplifier, and a control device. The magnetic resonance system may include further components such as a basic field magnet and a control device for the magnetic resonance system. The control device is used to control the gradient field systems and the radio frequency amplifiers, to receive the measuring signals recorded by the high frequency antenna, to evaluate the measuring signals, and to create magnetic resonance data. The magnetic resonance system is designed to determine amount information about a maximum energy as a function of a damage model for a patient to be examined with the magnetic resonance system. The maximum energy indicates the maximum amount of radio frequency energy which may be radiated into the patient during the examination of the patient in the magnetic resonance system. The magnetic resonance system is further designed to determine an amount of energy emitted by the radio frequency amplifier during the examination of the patient in the magnetic resonance system and to adjust the radio frequency amplifier as a function of a comparison of the amount information with the amount of energy emitted by the radio frequency amplifier. The determination of the amount information and the amount of energy emitted by the radio frequency amplifier and the adjustment of the radio frequency amplifier may be performed by the control device. The control device may include an electronic control device, (e.g., a microprocessor), and corresponding control information, (e.g., a control program), for this purpose. The magnetic resonance system is therefore suitable for the performance of the previously described method and its embodiments and thus also includes the advantages described in connection with the method previously described.

Furthermore, a computer program is provided. The computer program may be loaded into a storage device of a programmable control device of a magnetic resonance system. All or various previously described embodiments of the method may be performed with this computer program if the computer program is running in the programmable control device. The computer program may require program resources, (e.g., libraries or auxiliary functions), to realize the corresponding embodiments of the method. In other words, the computer program may protect a computer program or software with which one of the above-described embodiments of the method may be performed, or which performs this embodiment. The software may be source code, (e.g., C++), which still needs to be compiled and translated and linked, or which only needs to be interpreted, or an executable software code which only remains to be loaded into the corresponding control device for execution.

Finally, the present disclosure provides an electronically readable data carrier, (e.g., a DVD, a magnetic tape, or a USB stick), on which electronically readable control information, (e.g., software), as previously described, is stored. When this control information is read by the data carrier and stored in a control device, all the embodiments of the described method may be performed.

BRIEF DESCRIPTION OF THE DRAWINGS

The present disclosure is explained in more detail hereinafter with reference to the diagrams with the aid of embodiments.

FIG. 3 depicts a diagrammatic view of a method for a magnetic resonance system according to an embodiment for avoiding injury to a patient during an examination in the magnetic resonance system.

DETAILED DESCRIPTION

Figure 1:
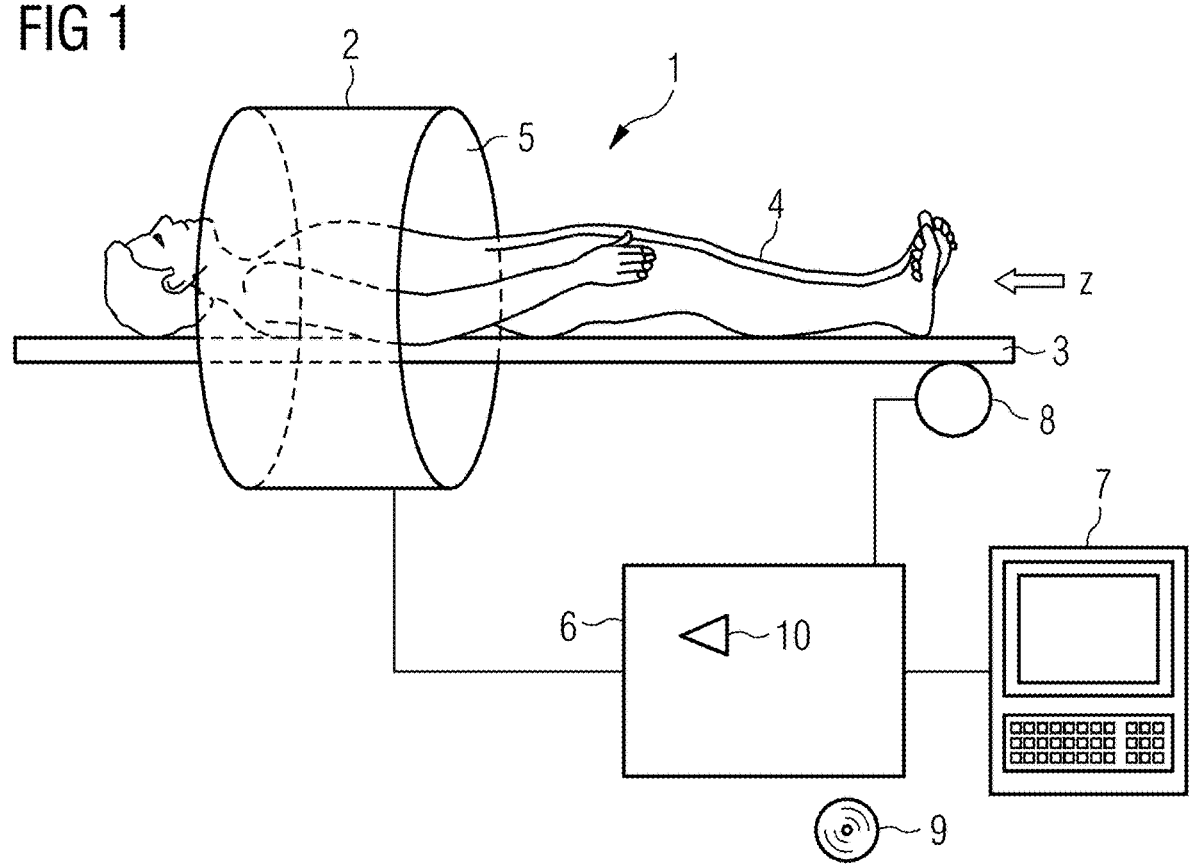
FIG. 1 depicts a diagrammatic view of a magnetic resonance system according to an embodiment.

FIG. 1 depicts a diagrammatic view of a magnetic resonance system 1. The magnetic resonance system 1 includes a scanner 2, an examination table 3 for a person for examination 4 which may be moved on the examination table 3 through an opening 5 of the scanner 2, a control device 6, an evaluation device 7, and a drive unit 8. The control device 6 controls the scanner 2 and receives signals from the scanner 2, which are recorded by the scanner 2. To generate the magnetic resonance data, the scanner 2 has a basic field magnet, which generates a basic magnetic field BO, and a gradient field system to generate gradient fields. Furthermore, the scanner 2 includes one or more high frequency antennas for generating high frequency signals and for receiving measuring signals which are used by the control device 6 and the evaluation device 7 to generate magnetic resonance images. The high frequency antennas are controlled by a radio frequency amplifier 10 to generate the high frequency signals. The radio frequency amplifier 10 is controlled by the control device 6. Furthermore, the control device 6 controls the drive unit 8 to move the examination table 3 through the opening 5 of the scanner 2 in one direction Z together with the person for examination 4. The control device 6 and the evaluation device 7 may include a computer system with a screen, a keyboard, and a data carrier 9 on which electronically readable control information is stored, which are designed such that they perform the method 40 described hereinafter with reference to FIG. 3 when the data carrier 9 is used in the evaluation device 7 and the control device 6.

To provide that exposure of the person for examination (e.g., patient) to electromagnetic fields remains within permissible limits, corresponding limit values may be determined for various areas of the body and operation modes with a computer program and transferred to an online monitoring unit which may be designed as part of the control device 6. For example, the online monitoring unit determines the emitted radio frequency power by voltage measurement on the radio frequency amplifier 10. From this, the power loss remaining in the transmitting devices (e.g., high frequency antennas) may be subtracted. Using the mass of the patient 4, an actual Specific Absorption Rate (SAR) may be determined therefrom in act 41 and compared with the corresponding limit values in act 42. If the permissible limit value is exceeded for the Specific Absorption Rate, the radio frequency amplifier 10 is switched off in act 47 and the performance of the magnetic resonance examination discontinued as a result.

In the event of an error in this online monitoring, (e.g., if an uncontrolled behavior occurs in the transmitter chain which is not detected), additional monitoring is performed in parallel to the previously described online monitoring (acts 41 and 42). This additional monitoring may be performed by the control device 6 or by a separate control device or a dedicated hardware device which is part of the control device 6.

This additional monitoring is based on the fact that a certain amount of energy is required for a burn on or in the body of the patient 4. Burns may be described by the Arrhenius equation as a first-order kinetic reaction. From this, a damage integral may be derived which describes the course of time of the damage Ω according to the following equation (1).

$$\Omega(t_{max}) = \int_0^{t_{max}} e^{\frac{-E_a}{RT(t)}} dt \quad (1)$$

The parameter A relates to a tissue-specific pre-exponential factor which, for example, may have a value of $4.322 \times 10^{64}$ per second for skin damage and a value of $1.19 \times 10^{35}$ per second for cell damage. $E_a$ relates to a tissue-specific activation energy which, for example, may have a value of 418,000 J/mol for skin damage and a value of 231,800 J/mol for cell damage. The parameter R is the universal gas constant with the value 8.31447115 J/K/mol and T is the absolute tissue temperature in Kelvin.

With regard to skin burns, for example, a first degree burn may occur from $\Omega=0.53$, a second degree burn from $\Omega=1.0$ and a third degree burn from $\Omega=10^4$. For cell damage, comparable values may be presumed.

A temperature profile for the heating of tissue may be presumed to be an e-function in accordance with the following equation (2) in a first approximation.

$$T(t) = T_{start} + T_{inc}\left(1 - e^{\frac{-t}{\tau}}\right) \quad (2)$$

$T_{start}$ is the absolute tissue temperature before heating in Kelvin and $T_{inc}$ a maximum achievable change in tissue temperature in a steady state in Kelvin. For $T_{start}$, for example, a normal body temperature of 37° C., that is to say 310 K, may be used. τ denotes a time constant of the heating process in seconds. The time constant τ may be estimated or determined by simulated calculations or metrologically. Depending on the type of tissue, τ may range from a few hundred to 2000 seconds. The worst case assumption for skin is τ=2000 seconds.

As the specific thermal capacity of tissue may be assumed to be constant, the change in temperature depends on the local specific absorption rate (SAR) and the time constant τ according to the following equation (3).

$$T_{inc} = \frac{SAR_{loc} * \tau}{C} \quad (3)$$

The parameter C denotes the specific thermal capacity of tissue and, for example, has a value in the order of 3391 J/kg/K for skin and a value in the order of 3630 J/kg/K for brain matter.

The maximum local specific absorption rate may be determined either directly by way of the maximum deliverable average output of the radio frequency amplifier $P_S$ or indirectly by way of a maximum global specific absorption rate. In the latter case, a maximum possible advantage factor F of the local specific absorption rate versus the global specific absorption rate may be used. The advantage factor may be obtained by measurement, simulation or by way of a model estimation. As the maximum achievable global specific absorption rate depends on the maximum deliverable average output of the radio frequency amplifier $P_S$, the level of efficiency of the transmission system and the mass of the patient, the local specific absorption rate may be determined according to the equation (4).

$$SAR_{loc} = F * \frac{\eta}{m} * P_S \quad (4)$$

η denotes the level of efficiency of the transmission system and m the mass of the patient in kilograms. The maximum deliverable transmission power of the system $P_S$ is specified in watts. The level of efficiency η may be in the range of 0-80%.

Values for a maximum global specific absorption rate may be in the range of 4 W/kg and values for a maximum local specific absorption rate may be in the range of 20-80 W/kg.

The level of efficiency is in turn dependent on the power which remains in the transmitter coil as power dissipation, $P_{Sp}$ and the power which is radiated into the patient $P_P$. Thus, the following applies for the level of efficiency η:

$$\eta = \frac{1}{1 + \frac{P_{Sp}}{P_P}} \quad (5)$$

As the power in the patient is proportional to their total mass m in the first approximation, equation (6) follows.

$$\frac{\eta}{m} = \frac{1}{m + m_0} \quad (6)$$

$m_0$ is the smallest patient mass in kilograms at which a level of efficiency of 50% is achieved. Depending on the transmission system, customary values for the smallest patient mass $m_0$ are in the range of 20-90 kg.

This results in the relationship between the damage integral according to equation (1) and the maximum deliverable transmission power of the radio frequency amplifier 10 to the following equation (7).

$$\Omega(t_{max}) = A \int_0^{t_{max}} \frac{-E_a}{e^{R\left(T_{start} + \frac{F}{m+m_0} P_S \frac{\tau}{C}\left(1 - e^{\frac{-t}{\tau}}\right)\right)}} dt \quad (7)$$

Figure 2:
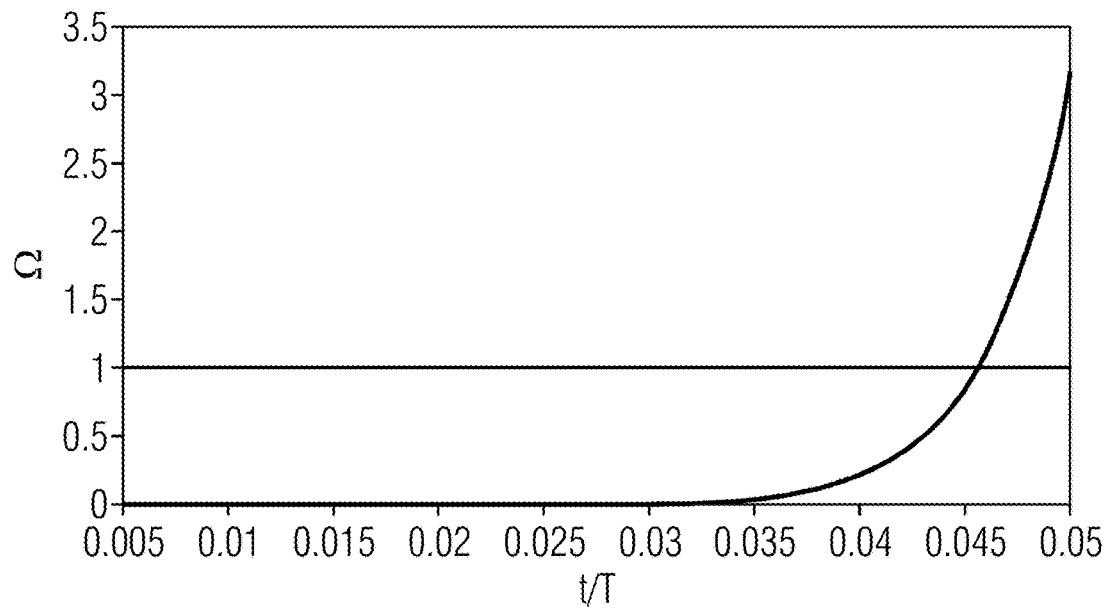
FIG. 2 depicts a diagrammatic view of a standardized course of tissue damage information according to an embodiment.

FIG. 2 depicts the course of the damage integral Ω over the time standardized to τ. The point of intersection with the maximum permissible damage value (in FIG. 2, for example, the value 1) determines the maximum permissible time $t_{max}$ during which the maximum transmission power $P_S$ may be output. In FIG. 2 this point of intersection is approximately $t_{max}/\tau=0.045$.

From this, it is possible to determine the maximum permissible amount of energy $E_{max}$ according to equation (8) which is to be limited.

$$E_{max} = P_S * t_{max} \quad (8)$$

Therefore, in the method 40 of FIG. 3, in act 43, the maximum permissible amount of energy $E_{max}$ is determined and, in act 44, the amount of energy emitted by the radio frequency amplifier 10 over the time $t_{max}$ is determined as a product of the maximum average transmitting power and the time. If it is determined in act 45 that the amount of energy emitted by the radio frequency amplifier 10 exceeds the maximum permissible amount of energy $E_{max}$, the radio frequency amplifier 10 is switched off in act 47. As long as neither the SAR threshold value nor the maximum permissible amount of energy $E_{max}$ is exceeded, the magnetic resonance examination is performed in act 46 and the method continued in act 41.

In summary, in the monitoring in acts 43 to 45 of the method 40, only the emitted transmission power is monitored against a fixed limit. This may be realized simply and cost-effectively. As this method is fundamentally different from the online monitoring of acts 41 and 42, a high level of patient safety may be achieved when operating the magnetic resonance system in order to avoid burns.

The embodiments previously described are only examples. Further modifications are possible. For example, other Arrhenius parameters may be used for other tissue parameters. Likewise, a limit value 1 other than that shown in FIG. 2 may be used in conjunction with the damage integral $\Omega$. These limit values, above all for other types of tissue, may be obtained by an analogy observation, in that the damage integral is determined during the maximum exposure of the patient which is deemed to be harmless to the patient. A simplification of the damage model may be achieved by using the CEM43 method (cumulative equivalent minutes at 43° C.) with corresponding limit values. Moreover, the temperature profile in the tissue may be determined by measurement, simulation or model estimation and, in addition, the perfusion change may be taken into account, which reduces the maximum achievable tissue temperature and may influence the time constant $\tau$. Furthermore, limited thermoregulation in patients may be taken into account, for example, by a larger value for $\tau$. Model refinements are possible, especially for babies, by taking into account the developmentally fluctuating body fat percentage to determine the absorbed power. Furthermore, model refinements are possible by taking account of the area permeated by the magnetic fields, which determines the induced voltage and thus the absorbed power in the body.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for a magnetic resonance system, the method comprising:
   determining amount information regarding a maximum energy as a function of a damage model for a patient to be examined with the magnetic resonance system, wherein the maximum energy indicates a maximum radio frequency energy configured to be radiated into the patient in an examination of the patient, and wherein the determining of the amount information regarding the maximum energy as the function of the damage model comprises determining time-dependent damage information $\Omega$ for a time $t_{max}$ as:

$$\Omega(t_{max}) = A \int_0^{t_{max}} \frac{-E_a}{e^{R\left(T_{start} + \frac{F}{m+m_0} P_s \frac{\tau}{C}\left(1-e^{\frac{-t}{\tau}}\right)\right)}} dt$$

wherein A is a tissue-specific pre-exponential factor, $E_a$ is a tissue-specific activation energy, R is a universal gas constant, $T_{start}$ is an absolute tissue temperature before heating, F is an advantage factor of a local specific absorption rate (SAR) versus a global SAR, m is a mass of the patient, $m_0$ is a smallest patient mass at which a level of efficiency of 50% is achieved, $P_s$ is a maximum deliverable power of a radio frequency amplifier, $\tau$ is a time constant of a heating process, and C is a specific thermal capacity of a tissue of the patient;
   determining an amount of energy emitted by the radio frequency amplifier of the magnetic resonance system during the examination of the patient in the magnetic resonance system; and
   adjusting the radio frequency amplifier as a function of a comparison of the amount information with the amount of energy emitted by the radio frequency amplifier.

2. The method of claim 1, further comprising:
   deactivating the radio frequency amplifier when the amount of energy emitted by the radio frequency amplifier exceeds the amount information.

3. The method of claim 1, further comprising:
   recording a power emitted by the radio frequency amplifier over time during the examination of the patient in the magnetic resonance system.

4. The method of claim 1, wherein the damage model comprises an Arrhenius model.

5. The method of claim 1, wherein the time constant $\tau$ of the heating process is determined as a function of a perfusion in the tissue of the patient.

6. The method of claim 1, wherein the time constant $\tau$ of the heating process is determined as a function of a thermoregulation of the patient.

7. A method for a magnetic resonance system, the method comprising:
   determining amount information regarding a maximum energy as a function of a damage model for a patient to be examined with the magnetic resonance system, wherein the maximum energy indicates a maximum radio frequency energy configured to be radiated into the patient in an examination of the patient;
   determining an amount of energy emitted by a radio frequency amplifier of the magnetic resonance system during the examination of the patient in the magnetic resonance system; and
   adjusting the radio frequency amplifier as a function of a comparison of the amount information with the amount of energy emitted by the radio frequency amplifier,
   wherein the determining of the amount information regarding the maximum energy comprises determining time-dependent tissue damage information by an integral of chemical reaction kinetics over time according to the damage model as a function of:
   a maximum deliverable power of the radio frequency amplifier;
   a mass of the patient;
   a tissue-specific activation energy;
   a time constant of a heating process; and a specific thermal capacity of a tissue of the patient,
wherein the time-dependent tissue damage information is determined such that a radio frequency power in the patient is proportional to the mass of the patient.

8. The method of claim 7, wherein the time-dependent tissue damage information is further determined as a function of at least one of the following parameters:
a tissue-specific pre-exponential factor,
an absolute tissue temperature before heating,
an advantage factor of a local specific absorption rate (SAR) versus a global SAR,
a smallest patient mass in which a level of efficiency of 50% is achieved, or
a combination thereof.

9. The method of claim 8, wherein the time-dependent tissue damage information $\Omega$ is determined for a time $t_{max}$ as:

$$\Omega(t_{max}) = A \int_0^{t_{max}} e^{\frac{-E_a}{R\left(T_{start}+\frac{F}{m+m_0}P_s\frac{\tau}{C}\left(1-e^{\frac{-t}{\tau}}\right)\right)}} dt)$$

wherein:
A is the tissue-specific pre-exponential factor,
$E_a$ is the tissue-specific activation energy,
R is a universal gas constant,
$T_{start}$ is an absolute tissue temperature before heating,
F is the advantage factor of the local SAR versus the global SAR,
m is the mass of the patient,
$m_0$ is the smallest patient mass at which the level of efficiency of 50% is achieved,
$P_s$ is the maximum deliverable power of the radio frequency amplifier,
$\tau$ is the time constant of the heating process, and
C is the specific thermal capacity of the tissue of the patient.

10. The method of claim 7, wherein the time-dependent tissue damage information is determined as a function of a body size of the patient.

11. The method of claim 7, wherein the damage model comprises a CEM43 model.

12. The method of claim 7, further comprising:
determining a specific absorption rate for absorption of electromagnetic fields by the radio frequency amplifier in the patient; and
deactivating the radio frequency amplifier as a function of a comparison of the specific absorption rate with an absorption rate threshold value.

13. A magnetic resonance system comprising:
a gradient field system,
a high frequency antenna,
a radio frequency amplifier linked to the high frequency antenna, the radio frequency amplifier configured to output a high frequency signal; and
a control device configured to control the gradient field system and the radio frequency amplifier, receive measuring signals recorded by the high frequency antenna, evaluate the measuring signals, and generate magnetic resonance data,
wherein the magnetic resonance system is configured to:
determine amount information regarding a maximum energy as a function of a damage model for a patient to be examined with the magnetic resonance system, wherein the maximum energy indicates a maximum radio frequency energy configured to be radiated into the patient during an examination of the patient, wherein the determination of the amount information regarding the maximum energy comprises a determination of time-dependent tissue damage information by an integral of chemical reaction kinetics over time according to the damage model as a function of a maximum deliverable power of the radio frequency amplifier, a mass of the patient, a tissue-specific activation energy, a time constant of a heating process, and a specific thermal capacity of a tissue of the patient, wherein the time-dependent tissue damage information is determined such that a radio frequency power in the patient is proportional to the mass of the patient;
determine an amount of energy emitted by the radio frequency amplifier during the examination of the patient in the magnetic resonance system; and
adjust the radio frequency amplifier as a function of a comparison of the amount information with the amount of energy emitted by the radio frequency amplifier.

14. A non-transitory computer program product comprising a computer program configured to be loaded directly into a storage device of a programmable control device of a magnetic resonance system, which, when executed by the programmable control device, causes the programmable control device to at least perform:
determine amount information regarding a maximum energy as a function of a damage model for a patient to be examined with the magnetic resonance system, wherein the maximum energy indicates a maximum radio frequency energy configured to be radiated into the patient during an examination of the patient, wherein the determination of the amount information regarding the maximum energy comprises a determination of time-dependent tissue damage information by an integral of chemical reaction kinetics over time according to the damage model as a function of a maximum deliverable power of a radio frequency amplifier, a mass of the patient, a tissue-specific activation energy, a time constant of a heating process, and a specific thermal capacity of a tissue of the patient, wherein the time-dependent tissue damage information is determined such that a radio frequency power in the patient is proportional to the mass of the patient;
determine an amount of energy emitted by the radio frequency amplifier of the magnetic resonance system during the examination of the patient in the magnetic resonance system; and
adjust the radio frequency amplifier as a function of a comparison of the amount information with the amount of energy emitted by the radio frequency amplifier.

* * * * *